(12) United States Patent
Bouche et al.

(10) Patent No.: US 9,177,805 B2
(45) Date of Patent: Nov. 3, 2015

(54) INTEGRATED CIRCUITS WITH METAL-INSULATOR-SEMICONDUCTOR (MIS) CONTACT STRUCTURES AND METHODS FOR FABRICATING SAME

(71) Applicant: GLOBALFOUNDRIES, Inc., Grand Cayman (KY)

(72) Inventors: Guillaume Bouche, Albany, NY (US); Shao Ming Koh, Clifton Park, NY (US); Jeremy A. Wahl, Delmar, NY (US); Andy C. Wei, Queensbury, NY (US)

(73) Assignee: GLOBALFOUNDRIES, INC., Grand Cayman (KY)

(*) Notice: Subject to any disclaimer, the term of this patent is extended or adjusted under 35 U.S.C. 154(b) by 6 days.

(21) Appl. No.: 14/166,660

(22) Filed: Jan. 28, 2014

(65) Prior Publication Data

US 2015/0214059 A1 Jul. 30, 2015

(51) Int. Cl.
| | |
|---|---|
| H01L 21/00 | (2006.01) |
| H01L 21/84 | (2006.01) |
| H01L 21/28 | (2006.01) |
| H01L 21/8238 | (2006.01) |
| H01L 27/092 | (2006.01) |

(52) U.S. Cl.
CPC ...... *H01L 21/2807* (2013.01); *H01L 21/28158* (2013.01); *H01L 21/823821* (2013.01); *H01L 27/0924* (2013.01)

(58) Field of Classification Search
CPC ............ H01L 29/785; H01L 29/66795; H01L 29/78645; H01L 29/78648; H01L 21/84; H01L 21/00
USPC .................................. 438/157; 257/347, 402
See application file for complete search history.

(56) References Cited

U.S. PATENT DOCUMENTS

| 8,586,455 | B1* | 11/2013 | Chang et al. ................... 438/481 |
| 2013/0049138 | A1* | 2/2013 | Zhu et al. ...................... 257/401 |
| 2013/0093021 | A1* | 4/2013 | Guo et al. ...................... 257/347 |
| 2013/0200459 | A1* | 8/2013 | Adam et al. ................... 257/348 |
| 2014/0191325 | A1* | 7/2014 | Chowdhury et al. ......... 257/369 |

* cited by examiner

*Primary Examiner* — Phuc Dang
(74) *Attorney, Agent, or Firm* — Ingrassia Fisher & Lorenz, P.C.

(57) ABSTRACT

Integrated circuits having metal-insulator-semiconductor (MIS) contact structures and methods for fabricating integrated circuits having metal-insulator-semiconductor (MIS) contact structures are provided. In an embodiment, a method for fabricating an integrated circuit includes providing a fin structure formed from semiconductor material overlying a semiconductor substrate. The method includes depositing a layer of high-k dielectric material over the fin structure. Further, the method includes forming a metal layer or layers over the layer of high-k dielectric material to provide the fin structure with a metal-insulator-semiconductor (MIS) contact structure.

20 Claims, 8 Drawing Sheets

INTEGRATED CIRCUITS WITH METAL-INSULATOR-SEMICONDUCTOR (MIS) CONTACT STRUCTURES AND METHODS FOR FABRICATING SAME

TECHNICAL FIELD

The present disclosure generally relates to integrated circuits and methods for fabricating integrated circuits, and more particularly relates to integrated circuits having metal-insulator-semiconductor contact structures and methods for fabricating integrated circuits having metal-insulator-semiconductor contact structures.

BACKGROUND

The majority of present day integrated circuits are implemented by using a plurality of interconnected field effect transistors (FETs). Typical transistor devices include gate electrodes as control electrodes that are formed overlying a semiconductor substrate, and spaced-apart source and drain regions that are formed within the semiconductor substrate and between which currents can flow. For a transistor device, a control voltage may be applied to the gate electrode and control the flow of current through a channel in the semiconductor substrate between the source and drain regions and beneath the gate electrode.

A transistor device is accessed via conductive contacts typically formed on the source/drain regions. Each conductive contact is usually formed by siliciding a metal on the source/drain regions and then depositing a dielectric layer over the silicided source/drain regions and etching a contact opening in the dielectric layer. Metal is then deposited in the contact opening to form the contact structure. At reduced technology nodes, more and more circuitry is incorporated on a single integrated circuit chip and the sizes of each individual device in the circuit and the spacing between device elements decreases. However, one of the limiting factors in the continued shrinking of integrated semiconductor devices is the resistance of contacts to doped regions such as the source and drain regions. As device sizes decrease, the width of contacts decreases. As the width of the contacts decreases, the resistance of the contacts becomes increasingly larger. In turn, as the resistance of the contacts increases, the drive current of the devices decreases, thus adversely affecting device performance. Therefore, the importance of reducing contact resistance at source/drain regions is amplified at reduced technology nodes.

Metal-insulator-semiconductor (MIS) contact structures may provide reduced contact resistance. MIS contact structures include a thin dielectric insulator layer that is positioned between semiconductor material, such as the semiconductor material of a source/drain region, and metal contact material. MIS contact structure may reduce the barrier height between the semiconductor and the metal contact structures, leading to lower contact resistance despite the additional resistance presented by the thin dielectric insulator layer.

Accordingly, it is desirable to provide integrated circuits and methods for fabricating integrated circuits having metal-insulator-semiconductor contacts. In addition, it is desirable to provide integrated circuits and methods for fabricating integrated circuits that utilize common metal layers to form contact interfaces with source/drain regions in both PFET areas and NFET areas. Furthermore, other desirable features and characteristics of the present invention will become apparent from the subsequent detailed description of the invention and the appended claims, taken in conjunction with the accompanying drawings and this background of the invention.

BRIEF SUMMARY

Integrated circuits having metal-insulator-semiconductor (MIS) contact structures and methods for fabricating integrated circuits having metal-insulator-semiconductor (MIS) contact structures are provided. In accordance with one embodiment, a method for fabricating an integrated circuit includes providing a fin structure formed from semiconductor material overlying a semiconductor substrate. The method includes depositing a layer of high-k dielectric material over the fin structure. Further, the method includes forming a metal layer or layers over the layer of high-k dielectric material to provide the fin structure with a metal-insulator-semiconductor (MIS) contact structure.

In another embodiment, a method for fabricating an integrated circuit includes providing a semiconductor substrate having a PFET source/drain region and an NFET source/drain region. The method selectively forms a layer of high-k dielectric material over the PFET source/drain region. Further, the method deposits a metal layer or layers over the PFET source/drain region and the NFET source/drain region to form a metal-insulator-semiconductor (MIS) contact structure over the PFET source/drain region and a metal-semiconductor contact structure over the NFET source/drain region.

In accordance with another embodiment, an integrated circuit is provided. The integrated circuit includes a semiconductor substrate having an NFET source/drain region defined in a first fin structure and a PFET source/drain region defined in a second fin structure. The integrated circuit includes a layer of high-k dielectric material on the second fin structure in the PFET source/drain region. Further, the integrated circuit includes a metal layer or layers on the first fin structure in the NFET source/drain region and on the layer of high-k dielectric material in the PFET source/drain region. The metal layer or layers and the first fin structure form a metal-semiconductor contact structure in the NFET source/drain region. The metal layer or layers, the layer of high-k dielectric material, and the second fin structure form a metal-insulator-semiconductor (MIS) contact structure in the PFET source/drain region.

BRIEF DESCRIPTION OF THE DRAWINGS

Embodiments of integrated circuits having metal-insulator-semiconductor (MIS) contact structures and methods for fabricating integrated circuits having metal-insulator-semiconductor (MIS) contact structures will hereinafter be described in conjunction with the following drawing figures, wherein like numerals denote like elements, and wherein.

DETAILED DESCRIPTION

The following detailed description is merely exemplary in nature and is not intended to limit the integrated circuits or the methods for fabricating integrated circuits as claimed herein. Furthermore, there is no intention to be bound by any expressed or implied theory presented in the preceding technical field, background or brief summary, or in the following detailed description.

In accordance with the various embodiments herein, integrated circuits having metal-insulator-semiconductor (MIS) contact structures and methods for fabricating integrated circuits having metal-insulator-semiconductor (MIS) contact structures are provided. Specifically, integrated circuits described herein are provided with metal-insulator-semiconductor contact structures in PFET source/drain regions and metal-semiconductor contact structures in NFET source/drain regions. In exemplary embodiments, the PFET source/drain regions and NFET source/drain regions are formed in and/or on semiconductor fin structures.

To achieve reduced contact resistance in PFET source/drain regions and NFET source/drain regions using the same metal contact with the desired electrical properties, e.g., optimized Schottky barrier heights in both PFET source/drain regions and NFET source/drain regions, the PFET source/drain regions and NFET source/drain regions are processed differently. In an exemplary embodiment, a method for fabricating an integrated circuit includes selectively forming a layer of high-k dielectric material on the PFET source/drain regions. Then, the metal layer or layers forming the metal component of the contact structures is deposited on the NFET source/drain regions to form metal-semiconductor contacts and on the PFET source/drain regions to form the metal-insulator-semiconductor contacts. The metal may be selected for optimized Schottky barrier height in the NFET source/drain regions without leading to increased contact resistance in the PFET source/drain regions. In this manner, same metal contact to PFET source/drain regions and to NFET source/drain regions can be optimized to reduce contact resistance and improve device performance.

FIGS. 1-17 illustrate methods for fabricating integrated circuits having metal-insulator-semiconductor (MIS) contact structures in accordance with various embodiments herein. Various steps in the design and composition of integrated circuits are well known and so, in the interest of brevity, many conventional steps will only be mentioned briefly herein or will be omitted entirely without providing the well-known process details. Further, it is noted that integrated circuits include a varying number of components and that single components shown in the illustrations may be representative of multiple components.

Figure 1:
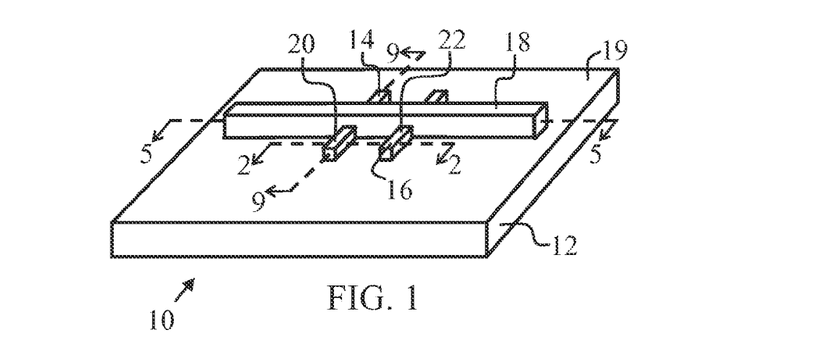
FIG. 1 illustrates, in perspective view, a portion of an integrated circuit having a sacrificial gate structure formed over fin structures in accordance with an embodiment herein.

In FIG. 1, an exemplary embodiment of a method for fabricating an integrated circuit 10 includes providing a semiconductor substrate 12. The semiconductor substrate 12 is formed from a semiconductor material such as, for example, silicon, including the relatively pure silicon materials typically used in the semiconductor industry as well as silicon admixed with other elements, such as germanium and the like. Alternatively, the semiconductor substrate 12 can be realized as germanium, gallium arsenide, and the like, or the semiconductor substrate 12 can include layers of different semiconductor materials. The semiconductor substrate 12 may be realized as a bulk silicon or silicon-on-insulator (SOI) wafer. Structures 14, such as fin structures, are formed on and/or from the semiconductor substrate 12. Each fin structure 14 has source/drain regions 16 that are defined in relation to a sacrificial gate 18. The fin structures 14 are formed according to known processes. For instance, when using a silicon-on-oxide semiconductor substrate 12, portions of a top silicon layer are selectively etched or otherwise removed leaving the fin structures 14 formed from the remaining silicon on the underlying oxide layer 19. As shown, sacrificial gate 18 is formed across the fin structures 14. Gate oxide and/or nitride capping layers (not shown) may be deposited over the fin structures 14 before the sacrificial gate 18 is formed. Further, a spacer layer (not shown) may be formed on the sides of the sacrificial gate 18 and a gate cap (not shown) may be formed on the top of the sacrificial gate 18. An exemplary sacrificial gate 18 is polysilicon or amorphous silicon and is formed by typical lithographic processing. Each fin structure 14 defines an NFET source/drain region 20 or a PFET source/drain region 22.

Figure 2:
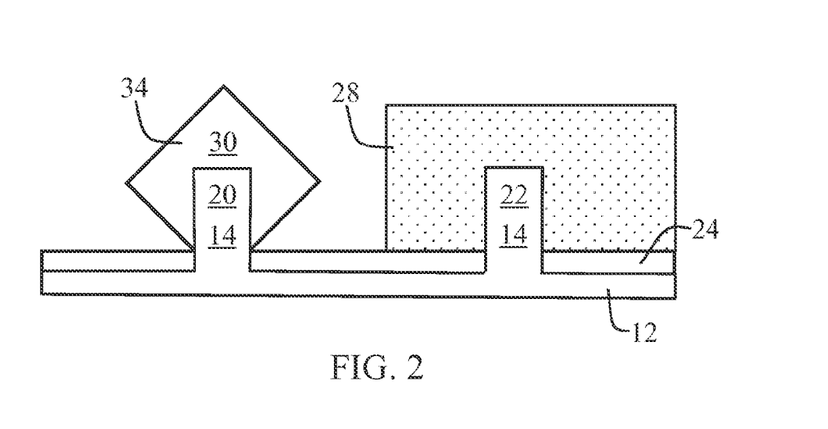
FIGS. 2-17 illustrate, in cross section, a portion of an integrated circuit and method steps for fabricating the integrated circuit with a metal-insulator-semiconductor (MIS) contact structure in accordance with various embodiments herein.
Figure 3:
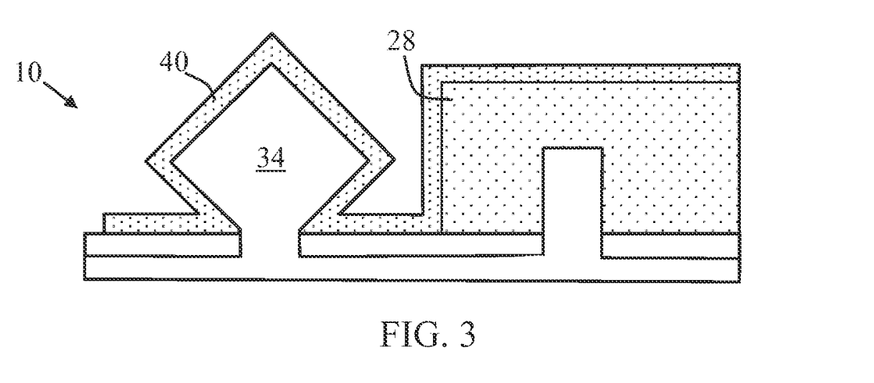
Figure 4:
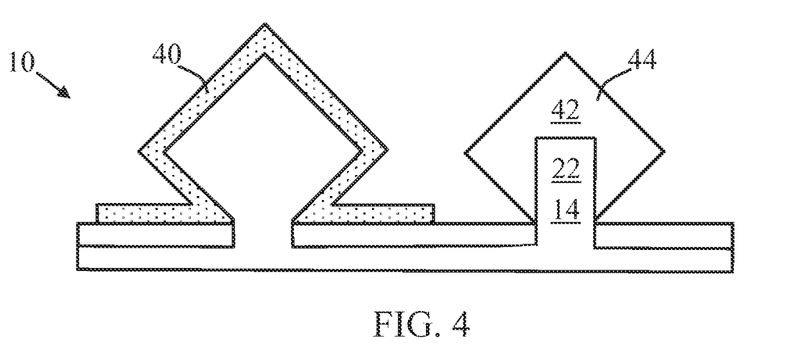

FIGS. 2-4 are cross-sectional views taken along line 2-2 in FIG. 1 and illustrate the fin structure 14 at a NFET source/drain region 20 and a fin structure 14 at a PFET source/drain region 22 during various steps of processing. In FIG. 2, the exemplary fin structures 14 have been formed and an isolation layer 24, such as oxide, has been formed over the semiconductor substrate 12. In an exemplary embodiment, a mask 28 is deposited and patterned to cover the PFET source/drain region 22. Then, an epitaxial growth process selectively forms additional semiconductor material 30 on the semiconductor material of the fin structure 14 defining NFET source/drain region 20. The epitaxial growth of the additional semiconductor material 30 forms a raised NFET source/drain region 34. In an exemplary embodiment, the additional semiconductor material 30 may comprise phosphorus-doped silicon, or other semiconductor material suitable for an NFET source/drain region 20. As shown, the additional semiconductor material 30 may provide the raised NFET source/drain region 34 with a "diamond-shaped" cross-section that occurs due to the slower rate of growth on the (111) surface.

The exemplary method may continue in FIG. 3 with the deposition of a dielectric cap 40 over the raised NFET source/drain region 34 and mask 28. An exemplary dielectric cap 40 can be silicon nitride, though other suitable materials may be used. In FIG. 4, a mask is deposited and patterned to cover the NFET source/drain region before the dielectric cap 40 and mask 28 overlying the PFET source/drain region 22 are etched to expose the fin structure 14 defining the PFET source/drain region 22. An epitaxial growth process selectively forms additional semiconductor material 42 on the semiconductor material of the fin structure 14 defining PFET source/drain region 22. The epitaxial growth of the additional semiconductor material 42 forms a raised PFET source/drain region 44. In an exemplary embodiment, the additional semiconductor material 42 may comprise silicon germanium, or other semiconductor material suitable for a PFET source/drain region 22. As shown, the additional semiconductor material 42 may provide the raised PFET source/drain region 44 with a "diamond-shaped" cross-section that occurs due to the slower rate of growth on the (111) surface.

Figure 5:
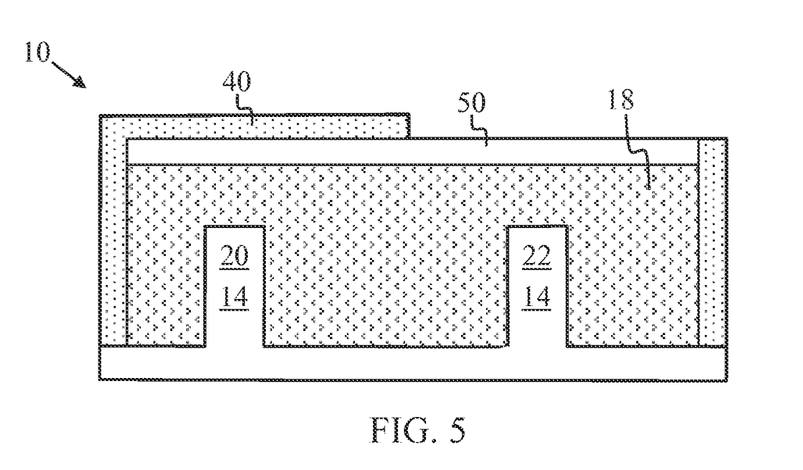

FIG. 5 illustrates partially fabricated integrated circuit 10 taken along line 5-5 in FIG. 1 and at the same stage of fabrication as FIG. 4. FIG. 5 illustrates the sacrificial gate 18 as including a sacrificial gate cap 50, such as a nitride cap, that is deposited during the gate formation process. As shown, the dielectric cap 40 is formed overlying the fin structure 14 forming the NFET source/drain regions 20 while it has been removed from over the fin structure 14 forming the PFET source/drain regions 22 during removal of the mask 28 described above in reference to FIG. 3.

Figure 6:
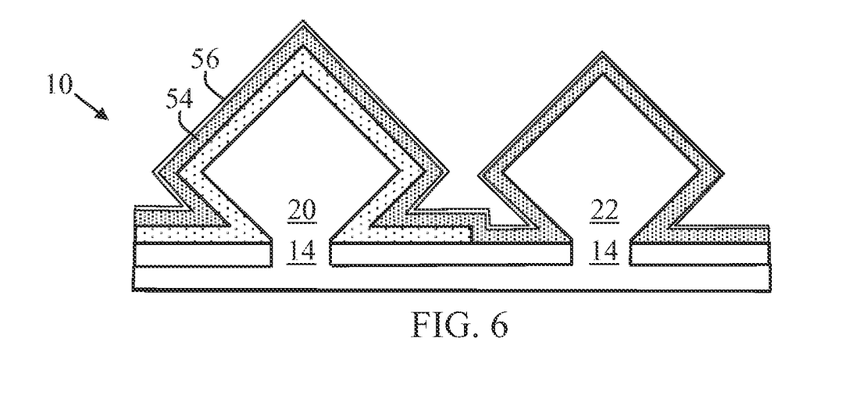
Figure 7:
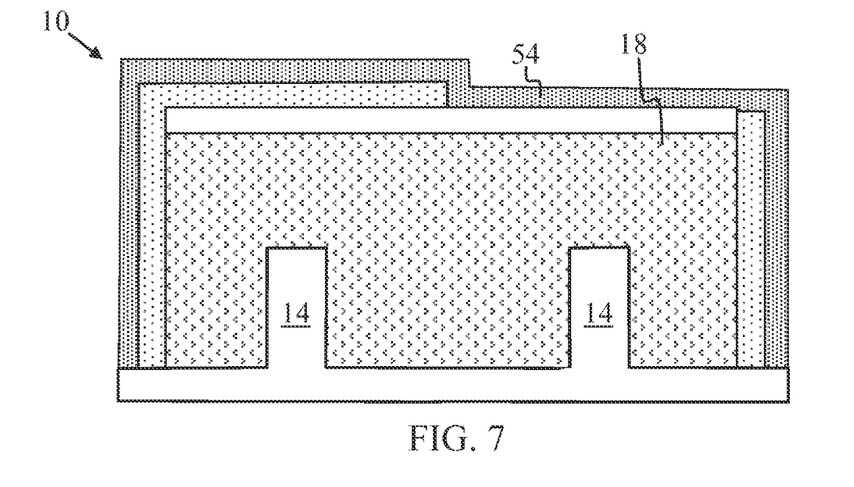

Referring now to FIGS. 6 and 7, cross sectional views of the fin structures 14 taken along lines 2-2 and 5-5, respectively, illustrate a further step of depositing a layer 54 of a high-k dielectric material over the NFET source/drain regions 20, PFET source/drain regions 22, and sacrificial gate 18. A high-k dielectric material is a material with a dielectric constant "k" value greater than that of silicon dioxide, i.e., greater than 3.9. The exemplary layer 54 of high-k dielectric material may include a single high-k material or a stack of films of two or more high-k dielectric materials. High-k dielectric materials suitable for forming the layer 54 include titanium oxide ($TiO_2$), aluminum oxide ($Al_2O_3$), hafnium oxide ($HfO_2$), or other materials suitable for processing and for forming the insulator portion of a metal-insulator-semiconductor contact. In an exemplary embodiment, the layer 54 of high-k dielectric material is deposited by an atomic layer deposition (ALD) process, though other suitable methods may be used. In an exemplary embodiment, the layer 54 of high-k dielectric material is formed with a thickness of about 1 nanometer (nm) to about 4 nm. FIG. 6 illustrates an optional embodiment in which a semiconductor film 56 is deposited over the layer 54 of high-k dielectric. For example, a film 56 of silicon, germanium, or silicon germanium may be deposited over layer 54. In an exemplary embodiment, the film 56 has a thickness of about 1 nm to about 2 nm. In an exemplary embodiment, the film 56 is deposited by physical vapor deposition (PVD), though other suitable methods may be used.

Figure 8:
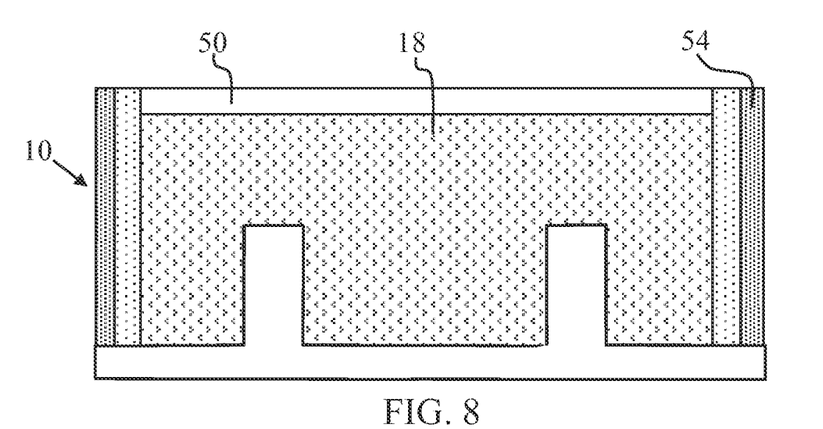

FIGS. 8-11 illustrate removal of the sacrificial gate 18 and formation of a replacement metal gate according to conventional processes. FIG. 8, taken along line 5-5 in FIG. 1, and FIG. 9, taken along line 9-9 in FIG. 1, illustrate the deposition and planarization of an interlayer dielectric 58 over the partially completed integrated circuit 10. The interlayer dielectric 58 is deposited over the partially fabricated integrated circuit 10 before a planarization process removes a portion of the interlayer dielectric 58, the layer 54 of high-k material and the dielectric cap 40 from the top of the sacrificial gate 18 in FIG. 8. For example, a planarization process such as chemical mechanical planarization (CMP) may be used to remove the interlayer dielectric 58, the layer 54 of high-k material and the dielectric cap 40 from over the sacrificial gate 18. As shown, the planarization process may stop on the sacrificial gate cap 50.

Figure 9:
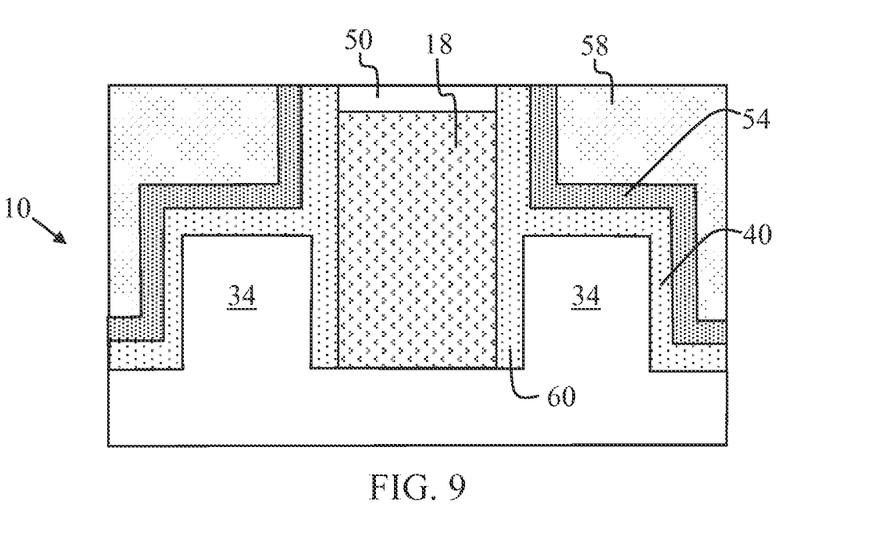

As shown in FIG. 9, the sacrificial gate 18 is bordered by a spacer or gate liner 60 that separates the sacrificial gate 18 from the raised NFET source/drain regions 34. An exemplary spacer 60 is silicon nitride. As further shown, the dielectric cap 40 extends over the raised NFET source/drain regions 34. An exemplary dielectric cap 40 is silicon nitride and may be considered to merge with the spacer 60. Further, the layer 54 of high-k dielectric material lies over the spacer 60 and dielectric cap 40, and is removed from overlying the sacrificial gate 18 during planarization.

Figure 10:
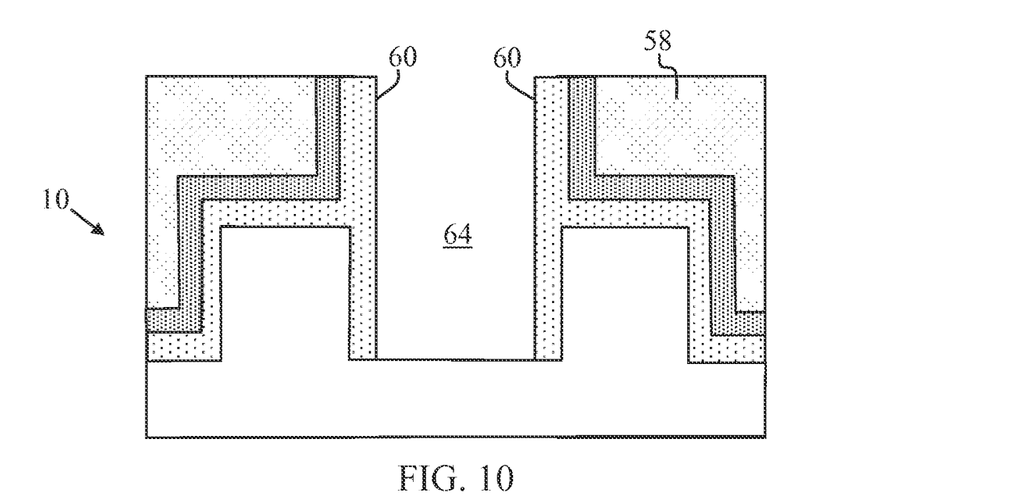

Removal of the sacrificial gate 18 is shown in FIG. 10. In an exemplary embodiment, the sacrificial gate cap 50 and a portion of the interlayer dielectric 58 are removed, such as by a CMP process or a reactive ion etch (RIE) process to expose the underlying sacrificial gate 18. The sacrificial gate 18 is then selectively removed. The sacrificial gate 18 may be removed with any appropriate etch technology, such as with a hot ammonia polysilicon wet etch. Also, any sacrificial layers underlying the sacrificial gate 18, such as a sacrificial gate oxide layer are removed. For example, a gate oxide layer may be removed by a diluted HF oxide wet etch. Removal of the sacrificial gate 18 forms a trench 64 bounded by spacers 60.

Figure 11:
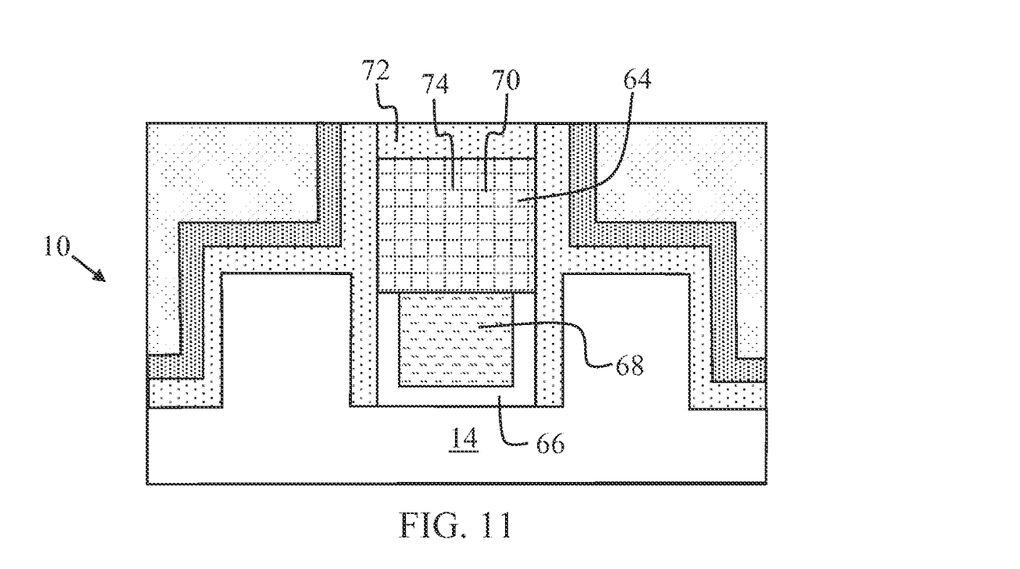

In FIG. 11, a high-k dielectric material 66 is conformally deposited in the trench 64 over the fin structure 14 such as by, for example atomic layer deposition (ALD). Then, a metal 68 is deposited over the high-k dielectric material 66. In an exemplary embodiment, the metal 68 is a workfunction metal selected for use in a NFET or PFET. For example, the metal 68 may be tantalum nitride, tantalum, titanium nitride or other metals known for having appropriate workfunction values for use in NFETs or PFETs. The workfunction of the metal can range from 4.05 eV which is silicon conduction bandedge to 5.2 eV which is silicon valence bandedge. The exemplary metal 68 may be deposited by any appropriate process, such as, for example, atomic layer deposition (ALD).

In an exemplary embodiment, overburden portions of the high-k dielectric material 66 and metal 68 are planarized such as by a CMP process and the high-k dielectric material 66 and metal 68 are recessed within the trench 64 by an appropriate etchant before another metal 70 is deposited in the trench 64 over the high-k dielectric material 66 and metal 68. An exemplary metal 70 is a fill metal that may be planarized easily, such as tungsten, aluminum, copper, or another low resistivity metal. In an exemplary embodiment, the metal 70 is deposited by chemical vapor deposition (CVD) to create an overburden above the trench 64 that is removed by a planarization process such as a CMP process. The metal 70 is then recessed to lower its upper surface to within the trench 64. An exemplary process anisotropically etches the metal 70 with any suitable conventional plasma dry etch chemistry selective to the metal 70. A capping material is deposited over the metal 70 to fill the trench 64 and create an overburden that is removed by planarization to form a cap 72. An exemplary cap 72 is formed from silicon nitride, though any appropriate material that can insulate the metal 70 in the trench 64 may be used. As shown, the replacement metal gate formation process forms a replacement metal gate structure 74 including the high-k dielectric material 66, metal 68, metal 70 and cap 72.

Figure 12:
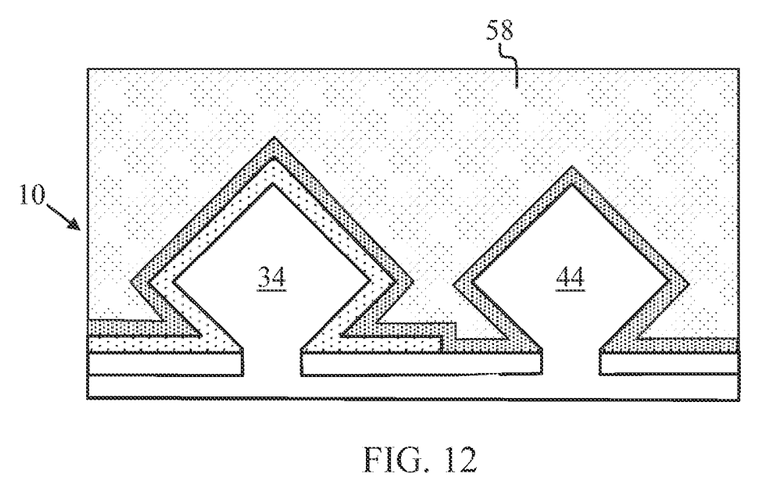
Figure 13:
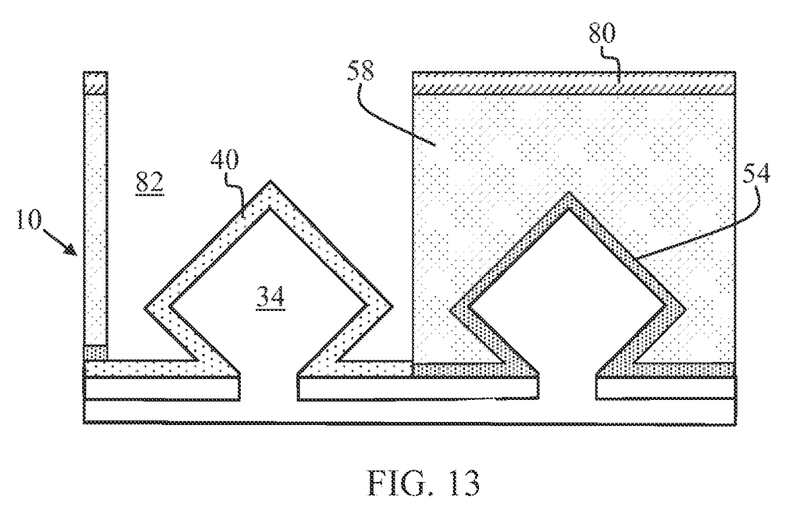

With the replacement metal gate formation process completed, the integrated circuit fabrication process continues with completion of the contact structures illustrated FIGS. 12-17, which are taken along lines 2-2 of FIG. 1. As shown in FIG. 12, the interlayer dielectric 58 deposited in FIG. 9 covers the raised NFET source/drain region 34 and the raised PFET source/drain region 44. In FIG. 13, a mask 80 is deposited and patterned to selectively expose the interlayer dielectric 58 positioned over the raised NFET source/drain region 34. Then, the interlayer dielectric 58 is anisotropically etched, such as with a reactive ion etch (RIE) process, to form a trench 82 and to expose the layer 54 of high-k dielectric material overlying the raised NFET source/drain region 34. The exposed layer 54 of high-k dielectric material is then etched. For example, the layer 54 of high-k dielectric material may be etched by a plasma assisted dry etch process selective to the high-k dielectric material. As a result, the dielectric cap 40 overlying the raised NFET source/drain region 34 is exposed.

Figure 14:
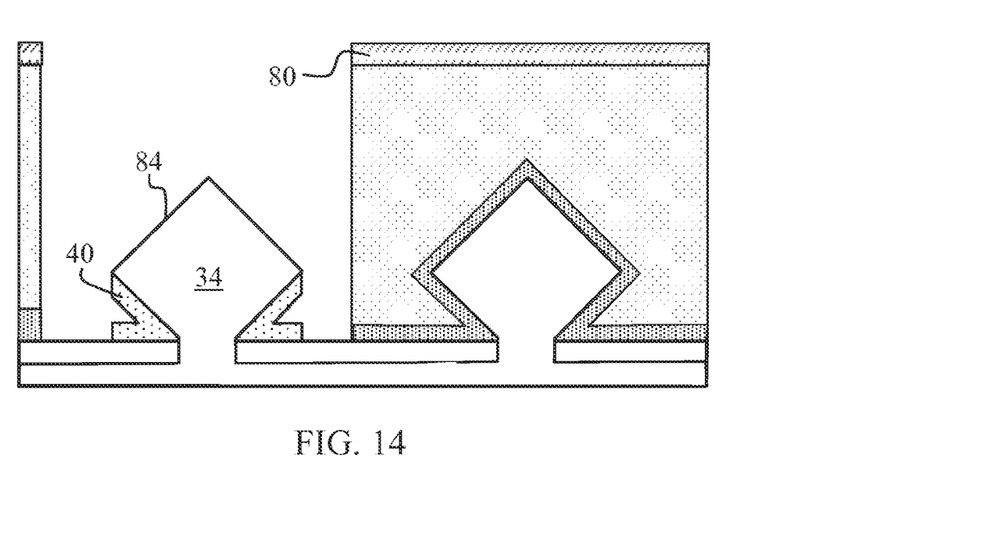

The dielectric cap 40 overlying the raised NFET source/drain region 34 is anisotropically etched as illustrated in FIG. 14. For example, the dielectric cap 40 may be etched by a reactive ion etch (RIE) process. As shown, this etch exposes the upper surfaces 84 of the raised NFET source/drain region 34.

Figure 15:
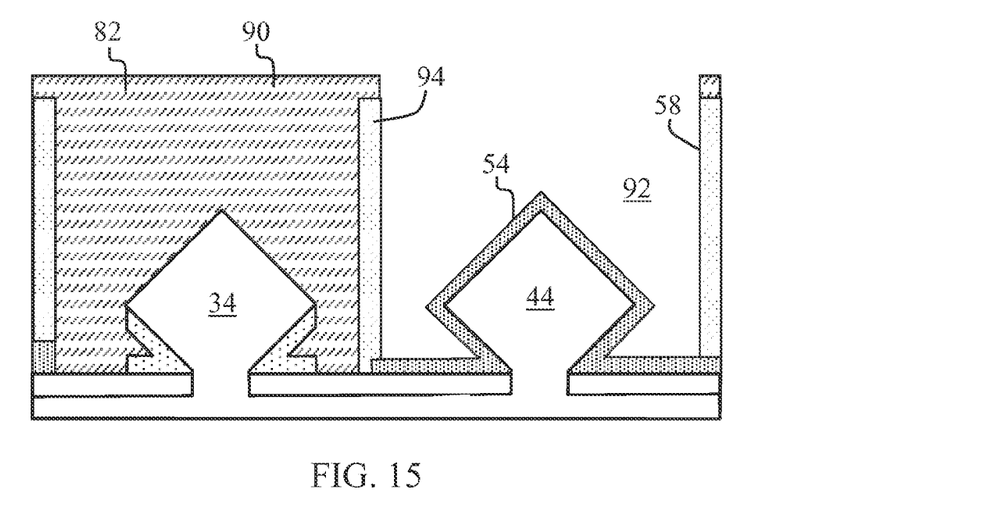

The method may continue in FIG. 15 with the removal of mask 80 and the deposition and patterning of mask 90 to cover the raised NFET source/drain region 34 and expose the interlayer dielectric 58 overlying the raised PFET source/drain region 44. The interlayer dielectric 58 overlying the raised PFET source/drain region 44 is then etched, such as with a reactive ion etch (RIE) process, to form a trench 92 and to expose the layer 54 of high-k dielectric material overlying the raised PFET source/drain region 44. As shown, a pillar portion 94 of the interlayer dielectric 58 remains between trenches 82 and 92. The interlayer dielectric pillar portion 94 can be eliminated by overlapping the pattern opening over the PFET source/drain region 44 towards the NFET source/drain region 34. An optional plasma assisted dry etch process selective to the high-k dielectric material may be performed to remove a portion of the layer 54 and any residual interlayer dielectric 58 in the trench 92. Alternatively, a standard post-RIE clean process may be performed to remove any residual interlayer dielectric 58 in the trench 92. It is noted that the layer 54 of high-k dielectric material inhibits the interlayer dielectric etch process as well as the optional plasma assisted dry etch process or post-RIE clean process from contacting and damaging the raised PFET source/drain region 44. Preventing damage to the raised silicon germanium source/drain of the PFET source/drain regions 44 is particularly beneficial as silicon germanium is susceptible to being gouged, leading to device variability.

Figure 16:
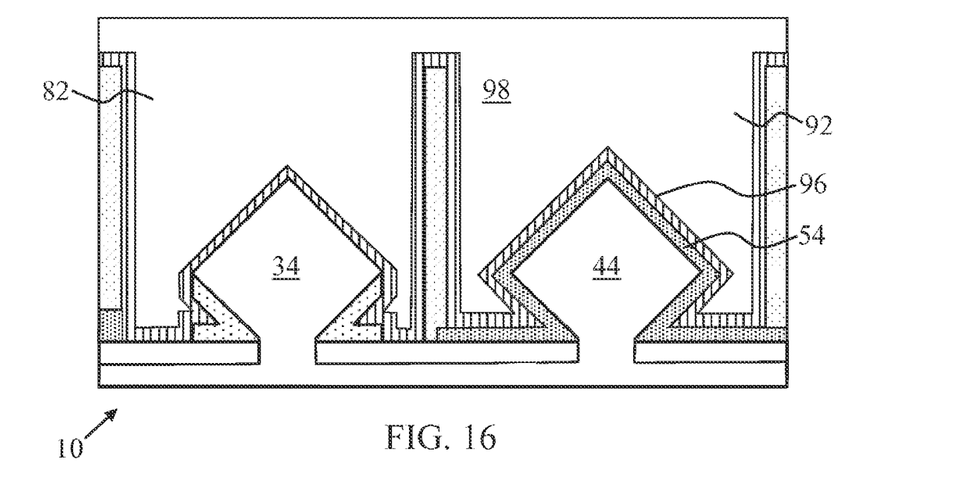

As shown in FIG. 16, the mask 90 is removed and a metal 96 is conformally deposited over partially fabricated integrated circuit 10. As shown, the metal 96 is formed on the raised NFET source/drain region 34 and on the layer 54 of high-k dielectric overlying the raised PFET source/drain region 44. An exemplary metal 96 is a barrier layer or layers such as titanium and/or titanium nitride, or other suitable metals for blocking ion migration, such as migration of fluorine. An exemplary process for depositing the metal 96 is atomic layer deposition (ALD) though other suitable methods may be used.

A fill metal 98 is then conformally deposited over partially fabricated integrated circuit 10. As shown, the fill metal 98 fills both trenches 82 and 92. The fill metal 98 contacts the metal 96 overlying both the raised NFET source/drain region 34 and the raised PFET source/drain region 44. An exemplary fill metal 98 is tungsten, though copper or any other suitable conductive metal that is easy to deposit and polish may be used. In an exemplary embodiment, the fill metal 98 is deposited by chemical vapor deposition (CVD) though any suitable process may be used.

Figure 17:
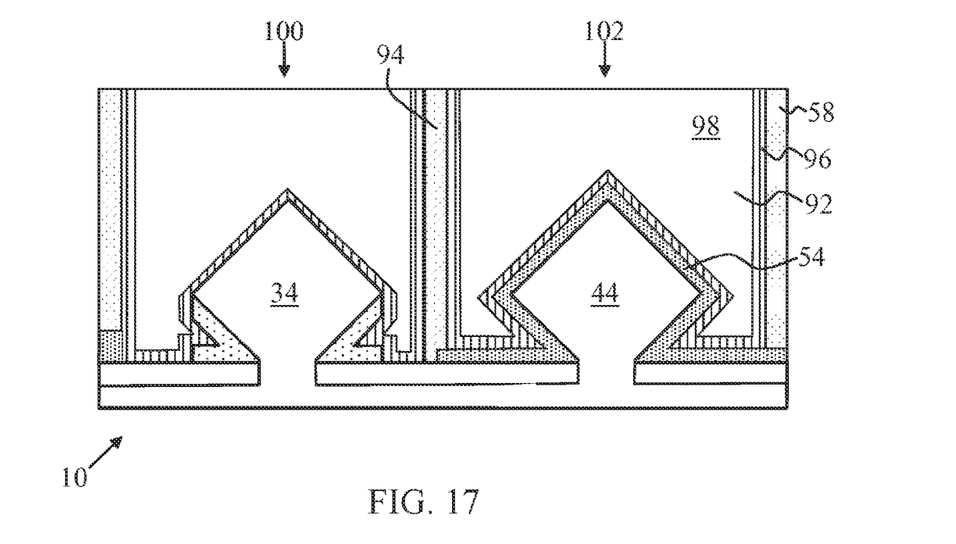

A planarization process such as a CMP process is performed in FIG. 17 to remove overburden portions of the fill metal 98 and metal 96 overlying the interlayer dielectric 58. As a result, separate contact structures 100 and 102 are formed in trenches 82 and 92, respectively and are isolated from one another by the portion 94 of the interlayer dielectric 58. As shown, the contact structure 100 forms a metal-semiconductor contact between the metal 96 and the raised NFET source/drain region 34. The contact structure 102 forms a metal-insulator-semiconductor contact between the metal 96, the layer 54 of dielectric material, and the raised PFET source/drain region 44. Further processing may form contacts to the contact structures 100 and 102 as well as to the replacement metal gate 74 and for interconnect structures in back-end-of-line processing.

The embodiments disclosed herein form a metal-insulator-semiconductor (MIS) contact structure to a source/drain region on a fin structure. In exemplary embodiments, the metal-insulator-semiconductor contact structure is formed as a PFET contact, while a metal-semiconductor contact structure is formed as an NFET contact. In an exemplary embodiment, the layer of dielectric material used to form the insulator portion of the metal-insulator-semiconductor contact structure protects the underlying semiconductor material from being damaged during etching processes that remove overlying layers. Here, the same metal or metals is utilized to attain the desired electrical properties such as optimized Schottky barrier height for both PFET and NFET contacts for contact resistance reduction. Specifically, metal-insulator-semiconductor contact structures over PFET source/drain regions lead to a reduction in contact resistance. As a result, the contact structure metal(s) may be selected for optimized Schottky barrier height in NFET contact structures without leading to an increase in PFET contact resistance. This allows contact resistance optimization for both PFET and NFET, hence improved device performance is achieved.

The fabrication methods described herein result in integrated circuits having metal-insulator-semiconductor (MIS) contact structures. While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for fabricating an integrated circuit, the method comprising:
   providing a fin structure formed from semiconductor material overlying a semiconductor substrate;
   depositing a layer of high-k dielectric material over the fin structure;
   forming a metal layer or layers over the layer of high-k dielectric material; and
   forming a metal-insulator-semiconductor (MIS) contact structure from the metal layer or layers, the layer of high-k dielectric material, and the fin structure.

2. The method of claim 1 further comprising depositing additional semiconductor material on the fin structure before depositing a layer of high-K dielectric material over the fin structure.

3. The method of claim 1 further comprising epitaxially growing silicon germanium on the fin structure before depositing a layer of high-k dielectric material over the fin structure.

4. The method of claim 1 further comprising:
   depositing an interlayer dielectric over the layer of high-k dielectric material; and
   selectively etching the interlayer dielectric with an etchant to expose the layer of high-K dielectric material, wherein the layer of high-k dielectric material prevents the etchant from damaging the fin structure.

5. The method of claim 1 further comprising
   depositing an interlayer dielectric over the layer of high-k dielectric material; and
   selectively etching the interlayer dielectric to form a trench and to expose the layer of high-k dielectric material; and
   wherein forming a metal layer or layers over the layer of high-k dielectric material comprises:
      depositing a metal barrier layer on the layer of high-k dielectric material; and
      depositing a fill metal on the metal barrier layer and filling the trench.

6. The method of claim 1 wherein providing a fin structure comprises providing a sacrificial gate structure overlying the fin structure, wherein depositing a layer of high-k dielectric material over the fin structure comprises depositing a layer of high-k dielectric material over the sacrificial gate structure, and wherein the method further comprises:
   removing the layer of high-k dielectric material from the sacrificial gate structure;
   etching the sacrificial gate structure to form a gate cavity; and
   forming a replacement metal gate in the gate cavity.

7. The method of claim 6 further comprising:
depositing an interlayer dielectric over the layer of high-k dielectric material overlying the fin structure and over the replacement metal gate; and
selectively etching the interlayer dielectric with an etchant to expose the layer of high-K dielectric material, wherein the layer of high-k dielectric material prevents the etchant from damaging the fin structure.

8. The method of claim 1 further comprising depositing a layer of silicon germanium over the layer of high-k dielectric material, wherein forming a metal layer or layers over the layer of high-k dielectric material comprises forming the metal layer or layers on the layer of silicon germanium.

9. A method for fabricating an integrated circuit, the method comprising:
providing a semiconductor substrate having a PFET source/drain region and an NFET source/drain region;
selectively forming a layer of high-k dielectric material over the PFET source/drain region; and
depositing a metal layer or layers over the layer of high-k dielectric material over the PFET source/drain region and over the NFET source/drain region to form a metal-insulator-semiconductor (MIS) contact structure over the PFET source/drain region and a metal-semiconductor contact structure over the NFET source/drain region.

10. The method of claim 9 wherein selectively forming a layer of high-k dielectric material over the PFET source/drain region comprises:
selectively forming a dielectric cap over the NFET source/drain region;
depositing the layer of high-k dielectric material over the PFET source/drain region and the NFET source/drain region; and
selectively etching the layer of high-k dielectric material and the dielectric cap from the NFET source/drain region.

11. The method of claim 9 wherein selectively forming a layer of high-k dielectric material over the PFET source/drain region comprises:
depositing the layer of high-k dielectric material over the PFET source/drain region and the NFET source/drain region;
depositing an interlayer dielectric over the PFET source/drain region and the NFET source/drain region;
etching the interlayer dielectric over the NFET source/drain region to form an NFET trench exposing the NFET source/drain region; and
etching the layer of high-k dielectric material over the PFET source/drain region.

12. The method of claim 11 further comprising etching the interlayer dielectric over the PFET source/drain region to form a PFET trench exposing the PFET source/drain region, wherein depositing a metal layer or layers over the PFET source/drain region and the NFET source/drain region to form a metal-insulator-semiconductor (MIS) contact structure over the PFET source/drain region and a metal-semiconductor contact structure over the NFET source/drain region comprises depositing the metal layer or layers in the NFET trench and in the PFET trench.

13. The method of claim 9 further comprising selectively depositing a first semiconductor material on the NFET source/drain region and a second semiconductor material on the PFET source/drain region before selectively forming the layer of high-k dielectric material over the PFET source/drain region.

14. The method of claim 9 further comprising selectively depositing phosphorus-doped silicon on the NFET source/drain region and silicon germanium on the PFET source/drain region before selectively forming the layer of high-k dielectric material over the PFET source/drain region.

15. The method of claim 9 further comprising selectively depositing a layer of silicon germanium over the layer of high-k dielectric material, wherein depositing a metal layer or layers over the PFET source/drain region and the NFET source/drain region to form a metal-insulator-semiconductor (MIS) contact structure over the PFET source/drain region and a metal-semiconductor contact structure over the NFET source/drain region.

16. The method of claim 9 wherein the NFET source/drain region is located on a first fin structure formed on the semiconductor substrate and the PFET source/drain region is located on a second fin structure formed on the semiconductor substrate, and wherein the method further comprises:
selectively depositing a first semiconductor material on the NFET source/drain region;
forming a dielectric cap over the first semiconductor material on the NFET source/drain region; and
selectively forming a second semiconductor material on the PFET source/drain region, wherein selectively forming a layer of high-k dielectric material over the PFET source/drain region comprises depositing the layer of high-k dielectric material over the NFET source/drain region in the NFET source/drain region and over second semiconductor material in the PFET source/drain region.

17. The method of claim 16 wherein providing a semiconductor substrate comprises providing a semiconductor substrate having a sacrificial gate structure formed over the first fin structure and the second fin structure, and wherein the method further comprises:
etching the sacrificial gate structure to form a gate cavity after selectively forming the layer of high-k dielectric material over the PFET source/drain region; and
forming a replacement metal gate in the gate cavity.

18. The method of claim 17 further comprising:
depositing an interlayer dielectric over the first fin structure, the second fin structure and the replacement metal gate;
selectively etching the interlayer dielectric to form an NFET trench and to expose the layer of high-k dielectric material in the NFET source/drain region;
etching the layer of high-k dielectric material from the NFET source/drain region;
etching the dielectric cap from the NFET source/drain region;
masking the NFET source/drain region; and
selectively etching the interlayer dielectric to form a PFET trench and to expose the layer of high-k dielectric material in the PFET source/drain region.

19. The method of claim 18 wherein depositing a metal layer or layers over the PFET source/drain region and the NFET source/drain region comprises:
depositing a metal barrier layer in the PFET trench and in the NFET trench; and
depositing a fill metal on the metal barrier layer and filling the PFET trench and the NFET trench.

20. An integrated circuit comprising:
a semiconductor substrate having an NFET source/drain region defined in a first fin structure and a PFET source/drain region defined in a second fin structure;
a layer of high-k dielectric material on the second fin structure in the PFET source/drain region;
a metal layer or layers on the first fin structure in the NFET source/drain region and on the layer of high-k dielectric material in the PFET source/drain region, wherein the metal layer or layers and the first fin structure form a metal-semiconductor contact structure in the NFET source/drain region, and wherein the metal layer or layers, the layer of high-k dielectric material, and the second fin structure form a metal-insulator-semiconductor (MIS) contact structure in the PFET source/drain region.

* * * * *